(12) United States Patent
Boyd et al.

(10) Patent No.: US 6,630,894 B1
(45) Date of Patent: Oct. 7, 2003

(54) SELF-POWERED SWITCHING DEVICE

(75) Inventors: Clark Davis Boyd, Hampton, VA (US); Bradbury R. Face, Smithfield, VA (US); Samuel A. Face, Jr., Norfolk, VA (US)

(73) Assignee: Face International Corp., Norfolk, VA (US)

( * ) Notice: Subject to any disclaimer, the term of this patent is extended or adjusted under 35 U.S.C. 154(b) by 543 days.

(21) Appl. No.: 09/616,978

(22) Filed: Jul. 14, 2000

(51) Int. Cl.$^7$ .................... H03M 11/00; H03K 17/94
(52) U.S. Cl. .................... 341/22; 341/176; 310/311; 310/318
(58) Field of Search ............. 341/22, 176, 825.69; 310/311, 314, 318; 367/157, 160

(56) References Cited

U.S. PATENT DOCUMENTS 5,471,721 A * 12/1995 Haertling .................... 29/25.35
5,605,336 A * 2/1997 Gaoiran et al. .............. 273/445

* cited by examiner

Primary Examiner—Timothy Edwards
(74) Attorney, Agent, or Firm—David J Bolduc

(57) ABSTRACT

A self-powered switching device using a prestressed flextensional electroactive member generates a signal for activation of a latching relay. The electroactive member has a piezoelectric element with a convex and a concave face that may be compressed to generate an electrical pulse. The flextensional electroactive member and associated signal generation circuitry can be hardwired directly to the latching relay or may be coupled to a transmitter for sending an RF signal to a receiver which actuates the latching relay.

16 Claims, 5 Drawing Sheets

SELF-POWERED SWITCHING DEVICE

BACKGROUND OF THE INVENTION

1. Field of the Invention

The present invention relates generally to switching devices for energizing lights, appliances and the like. More particularly, the present invention relates to a self-powered latching relay device using a prestressed piezoelectric element to generate an activation signal for the latching relay. The piezoelectric element and associated signal generation circuitry can be hardwired directly to the latching relay or may be coupled to a transmitter for sending an RF signal to a receiver which actuates the latching relay.

2. Description of the Prior Art

Switches and latching relays for energizing lights, appliances and the like are well known in the prior art. Typical light switches comprise, for example, single-pole switches and three-way switches. A single-pole switch has two terminals that are hot leads for an incoming line (power source) and an outgoing line to the light. Three-way switches can control one light from two different places. Each three-way switch has three terminals: the common terminal and two traveler terminals. A typical pair of three-way switches uses two boxes each having two cables with the first box having an incoming line from a power source and an outbound line to the second box, and the second box having the incoming line from the first box and an outbound line to the light.

In each of these switching schemes it is necessary drill holes and mount switches and junction boxes for the outlets as well as running cable. Drilling holes and mounting switches and junction boxes can be difficult and time consuming. Also, running electrical cable requires starting at a fixture, pulling cable through holes in the framing to each fixture in the circuit, and continuing all the way back to the service panel. Though simple in theory, getting cable to cooperate can be difficult and time consuming. Cable often kinks, tangles or binds while pulling, and needs to be straightened out somewhere along the run.

Remotely actuated switches/relays are also known in the art. Known remote actuation controllers include tabletop controllers, wireless remotes, timers, motion detectors, voice activated controllers, and computers and related software. For example, remote actuation means may include modules that are plugged into a wall outlet and into which a power cord for a device may be plugged. The device can then be turned on and off by a controller. Other remote actuation means include screw-in lamp modules wherein the module is screwed into a light socket, and then a bulb screwed into the module. The light can be turned on and off and can be dimmed or brightened by a controller.

An example of a typical remote controller for the above described modules is a radio frequency (RF) base transceiver. With these controllers, a base is plugged into an outlet and can control groups of modules in conjunction with a hand held wireless RF remote. RF repeaters may be used to boost the range of compatible wireless remotes, switches and security system sensors by up to 150 ft. per repeater. The base is required for all wireless RF remotes and allows control of several lamps or appliances. Batteries are also required in the hand held wireless remote.

Rather than using a hand held RF remote, remote wall switches may be used. These wall switches, which are up to ¾" thick, are affixed to a desired location with an adhesive. In conjunction with a base unit (plugged into a 110V receptacle) the remote wall switch may control compatible modules or switches (receivers). The wireless switches send an RF signal to the base unit and the base unit then transmits a signal along the existing 110V wiring in the home to compatible switches or modules. Each switch can be set with an addressable signal. Wireless switches also require batteries.

These remotes control devices may also control, for example, audio/video devices such as the TV, VCR, and stereo system, as well as lights and other devices using an RF to infrared (IR) base. The RF remote can control audio/video devices by sending proprietary RF commands to a converter that translates the commands to IR. IR commands are then sent to the audio/video equipment. The console responds to infrared signals from the infrared remotes and then transmits equivalent commands to compatible receivers.

A problem with conventional wall switches is that extensive wiring must be run both from the switch boxes to the lights and from the switch boxes to the power source in the service panels.

Another problem with conventional wall switches is that additional wiring must be run for lights controlled by more than one switch.

Another problem with conventional wall switches is that the high voltage lines are present as an input to and an output from the switch.

Another problem with conventional wall switches is the cost associated with initial installation of wire to, from and between switches.

Another problem with conventional wall switches is the cost and inconvenience associated with remodeling, relocating or rewiring existing switches.

A problem with conventional RF switches is that they still require an external power source such as high voltage AC power or batteries.

Another problem with conventional RF switches is the cost and inconvenience associated with replacement of batteries.

Another problem with conventional RF switches is that they require high power to individual modules and base units.

Another problem with conventional AC-powered RF switches is the difficulty when remodeling in rewiring or relocating a wall switch.

Accordingly, it would be desirable to provide a switching and/or latching relay device that overcomes the aforementioned problems of the prior art.

SUMMARY OF THE INVENTION

The present invention provides a self-powered switching or latching relay device using an electroactive actuator. The piezoelectric element in the actuator is capable of deforming with a high amount of axial displacement, and when deformed by a mechanical impulse generates an electric field. The electroactive actuator is used as an electromechanical generator for generating a momentary signal that actuates a latching/relay mechanism. The latching or relay mechanism thereby turns electrical devices such as lights and appliances on and off.

The mechanical actuating means for the electroactive actuator element should apply pressure to the electroactive actuator element with sufficient force/acceleration to generate an electrical pulse of sufficient magnitude and duration. A switch similar to a light switch, for example, may apply pressure through a toggle, snap action or roller mechanism. Larger or multiple electroactive actuator elements may also be used to generate pulses.

In one embodiment, the electroactive actuator is depressed by the manual or mechanical actuating means and the electrical signal generated by the electroactive actuator is applied directly to a relay switch. In another embodiment of the invention, circuitry is installed to modify the electrical pulse generated by the electroactive actuator. In yet another embodiment, the electroactive actuator signal powers an RF transmitter which sends an RF signal to an RF receiver which then actuates the relay. In yet another embodiment, the electroactive actuator signal powers a transmitter, which sends a pulsed RF signal to an RF receiver which then actuates the relay. Digitized RF signals may be coded (as with a garage door opener) to only activate the relay that is coded with that digitized RF signal.

Accordingly, it is a primary object of the present invention to provide a switching or relay device in which an electroactive or piezoelectric element is used to activate the device.

It is another object of the present invention to provide a device of the character described in which switches may be installed without necessitating additional wiring.

It is another object of the present invention to provide a device of the character described in which switches may be installed without cutting holes into the building structure.

It is another object of the present invention to provide a device of the character described in which switches do not require external electrical input such as 120 or 220 VAC or batteries.

It is another object of the present invention to provide a device of the character described incorporating an electroactive device that generates an electrical signal of sufficient magnitude to activate a latching relay.

It is another object of the present invention to provide a device of the character described incorporating an electroactive device that generates an electrical signal of sufficient magnitude to activate a radio frequency transmitter for activating a latching relay.

Further objects and advantages of the invention will become apparent from a consideration of the drawings and ensuing description thereof.

DESCRIPTION OF THE PREFERRED EMBODIMENT

Figure 1:
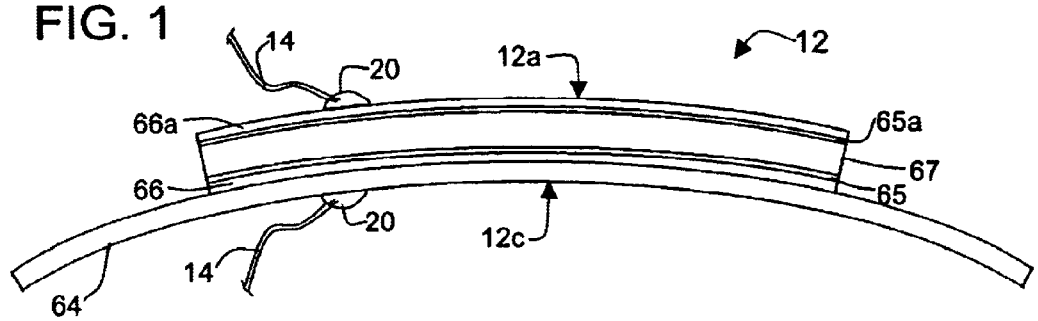
FIG. 1 is an elevation view showing the details of construction of a flextensional piezoelectric actuator used in the present invention.

Piezoelectric and electrostrictive materials (generally called "electroactive" devices herein) develop a polarized electric field when placed under stress or strain. The electric field developed by a piezoelectric or electrostrictive material is a function of the applied force causing the mechanical stress or strain. Conversely, electroactive devices undergo dimensional changes in an applied electric field. The dimensional change (i.e., expansion or contraction) of an electroactive device is a function of the applied electric field. Electroactive devices are commonly used as drivers, or "actuators" due to their propensity to deform under such electric fields. These electroactive devices or actuators also have varying capacities to generate an electric field in response to a deformation caused by an applied force.

Existing electroactive devices include direct and indirect mode actuators, which typically make use of a change in the dimensions of the material to achieve a displacement, but in the present invention are preferably used as electromechanical generators. Direct mode actuators typically include a piezoelectric or electrostrictive ceramic plate (or stack of plates) sandwiched between a pair of electrodes formed on its major surfaces. The devices generally have a sufficiently large piezoelectric and/or electrostrictive coefficient to produce the desired strain in the ceramic plate. However, direct mode actuators suffer from the disadvantage of only being able to achieve a very small displacement (strain), which is, at best, only a few tenths of a percent. Conversely, direct mode generator-actuators require application of a high amount of force to piezoelectrically generate a pulsed momentary electrical signal of sufficient magnitude to activate a latching relay.

Indirect mode actuators are known in the prior art to exhibit greater displacement and strain than is achievable with direct mode actuators by achieving strain amplification via external structures. An example of an indirect mode actuator is a flextensional transducer. Flextensional transducers are composite structures composed of a piezoelectric ceramic element and a metallic shell, stressed plastic, fiberglass, or similar structures. The actuator movement of conventional flextensional devices commonly occurs as a result of expansion in the piezoelectric material which mechanically couples to an amplified contraction of the device in the transverse direction. In operation, they can exhibit several orders of magnitude greater strain and displacement than can be produced by direct mode actuators.

The magnitude of achievable strain of indirect mode actuators can be increased by constructing them either as "unimorph" or "bimorph" flextensional actuators. A typical unimorph is a concave structure composed of a single piezoelectric element externally bonded to a flexible metal foil, and which results in axial buckling or deflection when electrically energized. Common unimorphs can exhibit a strain of as high as 10%. A conventional bimorph device includes an intermediate flexible metal foil sandwiched between two piezoelectric elements. Electrodes are bonded to each of the major surface of the ceramic elements and the metal foil is bonded to the inner two electrodes. Bimorphs exhibit more displacement than comparable unimorphs because under the applied voltage, one ceramic element will contract while the other expands. Bimorphs can exhibit strains up to 20%.

For certain applications of electroactive actuators knows in the prior art, asymmetrically stress biased electroactive devices have been proposed in order to increase the axial deformation of the electroactive material, and therefore increase the achievable to strain of the electroactive material. In such devices, (which include, for example, "Rainbow" actuators (as disclosed in U.S. Pat. No. 5,471,721), and other flextensional actuators) the asymmetric stress biasing produces a curved structure, typically having two major surfaces, one of which is concave and the other which is convex.

Referring to FIG. 1: A unimorph actuator called "THUNDER", which has improved displacement, strain and load capabilities, has recently been developed and is disclosed in U.S. Pat. No. 5,632,841. THUNDER (which is an acronym for THin layer composite UNimorph ferroelectric Driver and sEnsoR), is a unimorph actuator in which a pre-stress layer is bonded to a thin piezoelectric ceramic wafer at high temperature, and during the cooling down of the composite structure asymmetrically stress biases the ceramic wafer due to the difference in thermal contraction rates of the pre-stress layer and the ceramic layer.

The THUNDER actuator 12 is as a composite structure, the construction of which is illustrated in FIG. 1. Each THUNDER actuator 12 is constructed with an electroactive member preferably comprising a piezoelectric ceramic layer 67 of PZT which is electroplated 65 and 65a on its two opposing faces. A pre-stress layer 64, preferably comprising steel, stainless steel, beryllium alloy or other metal substrate, is adhered to the electroplated 65 surface on one side of the ceramic layer 67 by a first adhesive layer 66. In the simplest embodiment, the adhesive layer 66 acts as a prestress layer. The first adhesive layer 66 is preferably LaRC™-SI material, as developed by NASA-Langley Research Center and disclosed in U.S. Pat. No. 5,639,850. A second adhesive layer 66a, also preferably comprising LaRC-SI material, is adhered to the opposite side of the ceramic layer 67. During manufacture of the THUNDER actuator 12 the ceramic layer 67, the adhesive layer 66 and the pre-stress layer 64 are simultaneously heated to a temperature above the melting point of the adhesive material. In practice the various layers composing the THUNDER actuator (namely the ceramic layer 67, the adhesive layers 66 and 66a and the pre-stress layer 64) are typically placed inside of an autoclave or a convection oven as a composite structure, and slowly heated by convection until all the layers of the structure reach a temperature which is above the melting point of the adhesive 66 material but below the Curie temperature of the ceramic layer 67. It is desirable to keep the temperature of the ceramic layer 67 beneath the Curie temperature of the ceramic layer in order to avoid disrupting the piezoelectric characteristics of the ceramic layer 67. Because the multi-layer structure is typically convectively heated at a slow rate, all of the layers tend to be at approximately the same temperature. In any event, because an adhesive layer 66 is typically located between two other layers (i.e. between the ceramic layer 67 and the pre-stress layer 64), the ceramic layer 67 and the pre-stress layer 64 are usually very close to the same temperature and are at least as hot as the adhesive layers 66 and 66a during the heating step of the process. The THUNDER actuator 12 is then allowed to cool.

Figure 2:
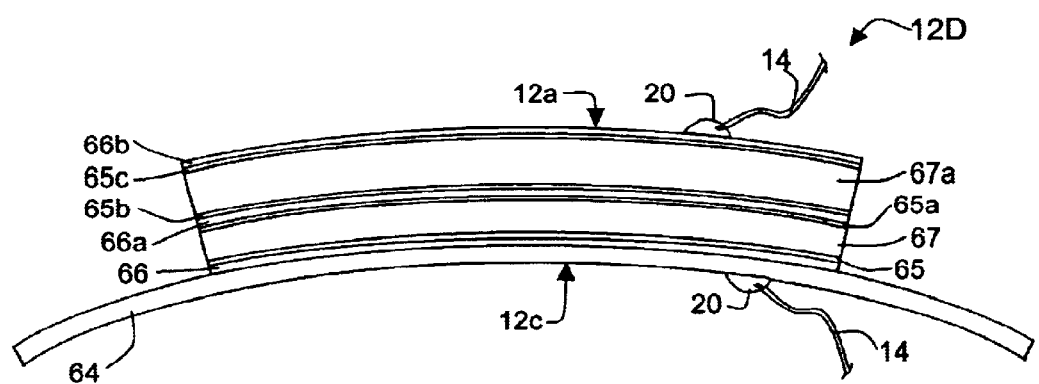
FIG. 2 is an elevation view showing the details of construction of an alternate multi-layer flextensional piezoelectric actuator used in a modification the present invention.

During the cooling step of the process (i.e. after the adhesive layers 66 and 66a have re-solidified) the ceramic layer 67 becomes compressively stressed by the adhesive layers 66 and 66a and pre-stress layer 64 due to the higher coefficient of thermal contraction of the materials of the adhesive layers 66 and 66a and the pre-stress layer 64 than for the material of the ceramic layer 67. Also, due to the greater thermal contraction of the laminate materials (e.g. the first pre-stress layer 64 and the first adhesive layer 66) on one side of the ceramic layer 67 relative to the thermal contraction of the laminate materials) (e.g. the second adhesive layer 66a) on the other side of the ceramic layer 67, the ceramic layer deforms in an arcuate shape having a normally convex face 12a and a normally concave face 12c, as illustrated in FIGS. 1 and 2. One or more additional pre-stressing layer(s) may be similarly adhered to either or both sides of the ceramic layer 67 in order, for example, to increase the stress in the ceramic layer 67 or to strengthen the actuator 12. Furthermore, the substrate comprising a separate prestress layer 64 may be eliminated and the adhesive layer 66 may apply the prestress to the ceramic layer 067. Alternatively, only the prestress layer(s) 64 and the adhesive layer(s) 66 may be heated and bonded to a ceramic layer 67, while the ceramic layer 67 is at a lower temperature, in order to induce greater compressive stress into the ceramic layer 67 when cooling the actuator 12.

As Referring now to FIG. 2: An alternate actuator 12D may include a composite piezoelectric ceramic layer that comprises multiple thin layers 67 and 67a of PZT which are bonded to each other. Each layer 67 and 67a comprises a thin layer of piezoelectric material, with a thickness preferably on the order of about 1 mil. Each thin layer 67 and 67a is electroplated 65 and 65a, and 65b and 65c on each major face respectively. The individual layers 67 and 67a are then bonded to each other with an adhesive layer 66a, using an adhesive such as LaRC-SI. Alternatively, and most preferably, the thin layers 67 and 67a may be bonded to each other by cofiring the thin sheets of piezoelectric material together. As few as two layers, but preferably at least four sheets of piezoelectric material may be bonded/cofired together. The composite piezoelectric ceramic layer may then be bonded to prestress layer(s) 64 with the adhesive layer(s) 66 and 66b, and heated and cooled as described above to make a modified THUNDER actuator 12D. By having multiple thinner layers 67 and 67a of piezoelectric material in a modified actuator 12D, the composite ceramic layer generates a lower voltage and higher current as compared to the high voltage and low current generated by a THUNDER actuator 12 having only a single thicker ceramic layer 67.

A flexible insulator may be used to coat the convex face 12a of the actuator 12. This insulative coating helps prevent unintentional discharge of the piezoelectric element through inadvertent contact with another conductor, liquid or human contact. The coating also makes the ceramic element more durable and resistant to cracking or damage from impact. Since LaRC-SI is a dielectric, the adhesive layer 67a on the convex face 12a of the actuator 12 may act as the insulative layer. Alternately, the insulative layer may comprise a plastic, TEFLON or other durable coating.

Electrical energy may be recovered from or introduced to the actuator element 12 by a pair of electrical wires 14. Each electrical wire 14 is attached at one end to opposite sides of the actuator element 12. The wires 14 may be connected (for example by glue or solder 20) directly to the electroplated 65 and 65a faces of the ceramic layer 67, or they may alternatively be connected to the pre-stress layer(s) 64. As discussed above, the pre-stress layer 64 is preferably adhered to the ceramic layer 67 by LaRC-SI material, which is a dielectric. When the wires 14 are connected to the pre-stress layer(s) 64, it is desirable to roughen a face of the pre-stress layer 64, so that the pre-stress layer 64 intermittently penetrates the respective adhesive layers 66 and 66a, and make electrical contact with the respective electroplated 65 and 65a faces of the ceramic layer 67. The opposite end of each electrical wire 14 is preferably connected to an electric pulse modification circuit 10.

Prestressed flextensional transducers 12 are desirable due to their durability and their relatively large vertical displacement, and concomitant relatively high voltage that such transducers are capable of developing. The present invention however may be practiced with any electroactive element having the properties and characteristics herein described, i.e., the ability to generate a voltage in response to a deformation of the device. For example, the invention may be practiced using magnetostrictive or ferroelectric devices. The transducers also need not be normally arcuate, but may also include transducers that are normally flat, and may further include stacked piezoelectric elements.

Figure 4:
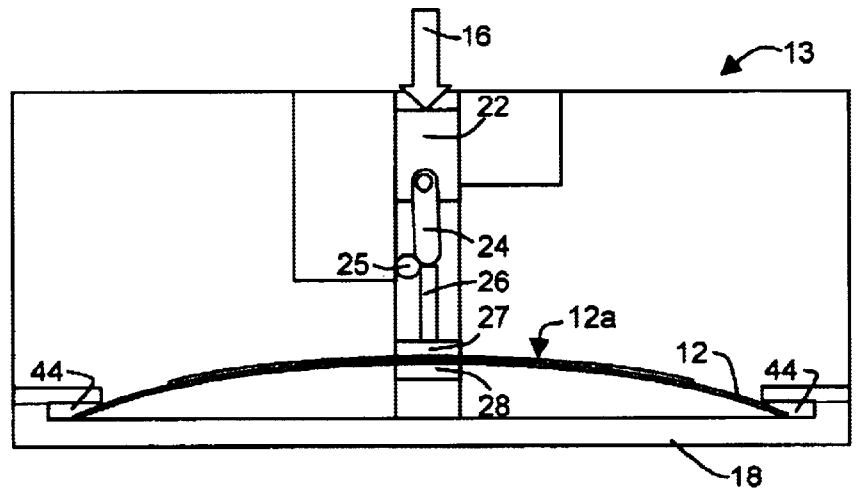
FIG. 4 is an elevation view of the device of FIG. 3 illustrating the deformation of the actuator upon application of a force.

In operation, as shown in FIG. 4, when a force indicated by arrow 16 is applied to the convex face 12a of the actuator 12, the force deforms the piezoelectric element 12. The force may be applied to the piezoelectric actuator 12 by any appropriate means such as by application of manual pressure directly to the piezoelectric actuator, or by other mechanical means. Preferably, the force is applied by a mechanical switch (e.g., a plunger, striker, toggle or roller switch) capable of developing a mechanical impulse for application to and removal from the actuator 12. The mechanical impulse (or removal thereof) should be of sufficient force to cause the convex face 12a of the actuator 12 to deform quickly and accelerate over a distance (approximately 10 mm) which generates an electrical signal of sufficient magnitude to activate an electromechanical latching relay.

Figure 3:
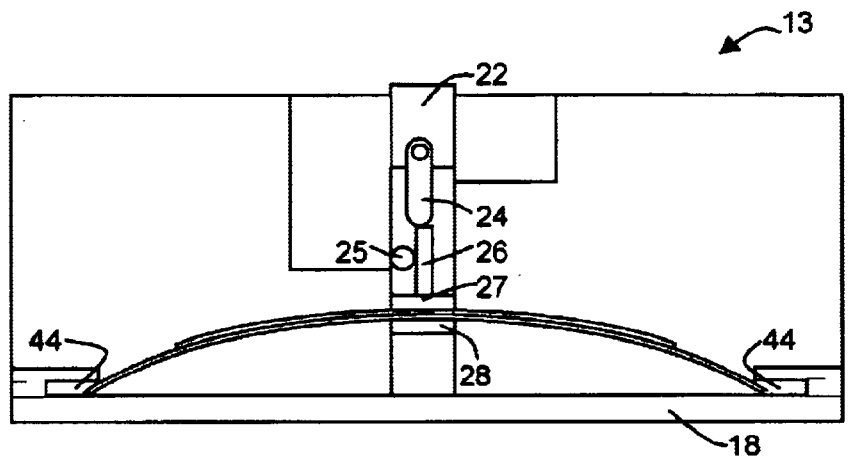
FIG. 3 is an elevation view of a device for mechanical application and removal of a force to an actuator.
Figure 5:
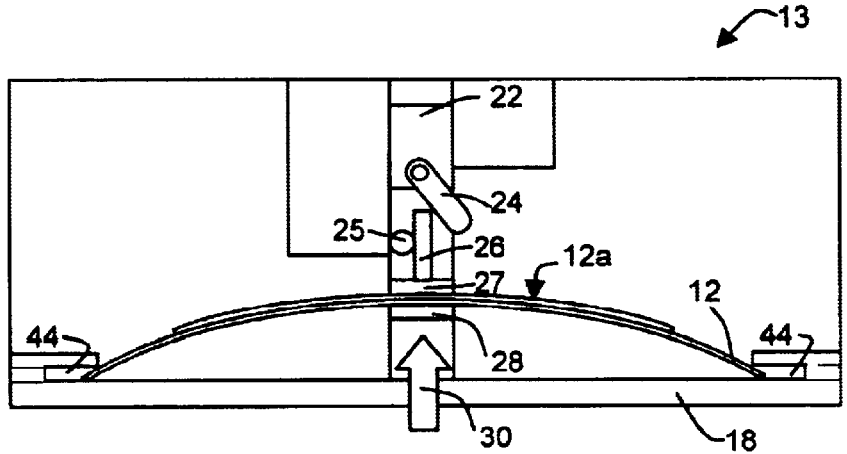
FIG. 5 is an elevation view of the device of FIG. 3 illustrating the recovery of the actuator upon removal of the force by tripping of a quick-release device.

Referring to FIGS. 3, 4 and 5: An illustration of a suitable means for application of mechanical force comprises a switch plate and a plunger assembly 13. The two ends of the piezoelectric actuator are each pivotably held in place within a recess 44 of a switch plate 18. The switch plate 18 is the same shape as the actuator 12 contained therein, preferably rectangular. In an alternate embodiment, a circular actuator may be mounted in a circular recess of a circular switch plate. The recess(es) 44 in the switch plate 18 hold the actuator 12 in place in its relaxed, i.e., undeformed state. The recesses 44 are also sufficiently deep to fully receive the ends or edges of the actuator 12 in its fully deformed, i.e., flat state. The plunger assembly comprises a push button 22 pivotably connected to a hinged quick-release mechanism 24. The opposite end of the quick-release mechanism 24 contacts shaft 26 connected to a pair of plates 27 and 28 which are clamped on both sides of the actuator 12. A release cog 25 is located along the path of the quick-release mechanism 24.

Referring to FIGS. 4 and 5: In operation, when the push button 22 is depressed in the direction of arrow 16, the quick-release mechanism 24 pushes down on the shaft 26 and plates 27 and 28 and deforms the actuator 12. When the quick-release mechanism 24 reaches the release cog 25, the quick-release mechanism 24 pivots on its hinge and releases the downward pressure from the shaft 26, plates 27 and 28 and actuator 12. The actuator 12, on account of the restoring force of the substrate of the prestress layer 64, returns quickly to its undeformed state in the direction of arrow 30 as in FIG. 5. Other means by which a force may be applied to and/or released from the actuator include twisting of door knob, opening a door that places pressure on an actuator in the jamb, stepping onto the actuator on the ground, floor or in a mat, or even sitting down.

As previously mentioned, the applied force causes the piezoelectric actuator to deform. By virtue of the piezoelectric effect, the deformation of the piezoelectric element 12 generates an instantaneous voltage between the faces 12a and 12c of the actuator 12, which produces a pulse of electrical energy. Furthermore, when the force is removed from the piezoelectric actuator 12, the actuator recovers its original arcuate shape. This is because the substrate or prestress layer 64 to which the ceramic 67 is bonded exerts a compressive force on the ceramic 67, and the actuator 12 thus has a coefficient of elasticity that causes the actuator 12 to return to its undeformed neutral state. On the recovery stroke of the actuator 12, the ceramic 67 returns to its undeformed state and thereby produces another electrical pulse of opposite polarity. The downward (applied) or upward (recovery) strokes should cause a force over a distance that is of sufficient magnitude to create the desired electrical pulse. The duration of the recovery stroke, and therefore the duration of the pulse produced, is preferably in the range of 50–100 milliseconds, depending on the amount of force applied to the actuator 12.

In the preferred embodiment of the invention, the electrical pulse that is generated upon removal of the force i.e., when the actuator 12 recovers its shape, is the pulse that is used. This is because the downward force applied, by hand for example, may be inconsistent, whereas the recovery force of the actuator is a more predictable and consistent force. Furthermore, because the second pulse has an opposite polarity to the first pulse, rapid application of the first and second pulse may cause an attached relay to simply open and close. Electrical filtering components (such as a diode or zero voltage switching circuitry) may be used to isolate the relay from the first pulse in order to only use the second pulse.

Figure 6:
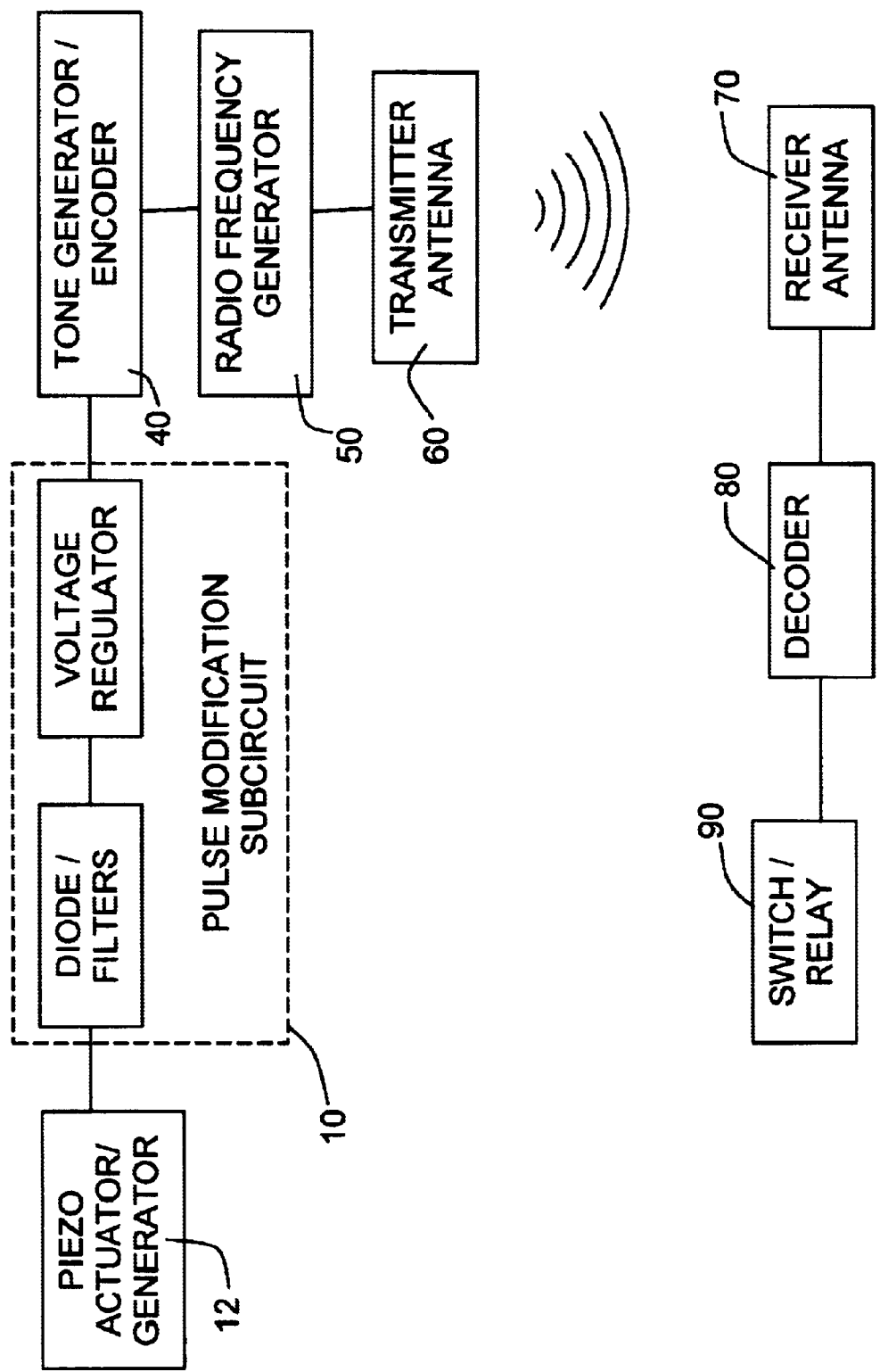
FIG. 6 is a schematic showing the switching device of the present invention incorporating flextensional piezoelectric actuator.
Figure 7:
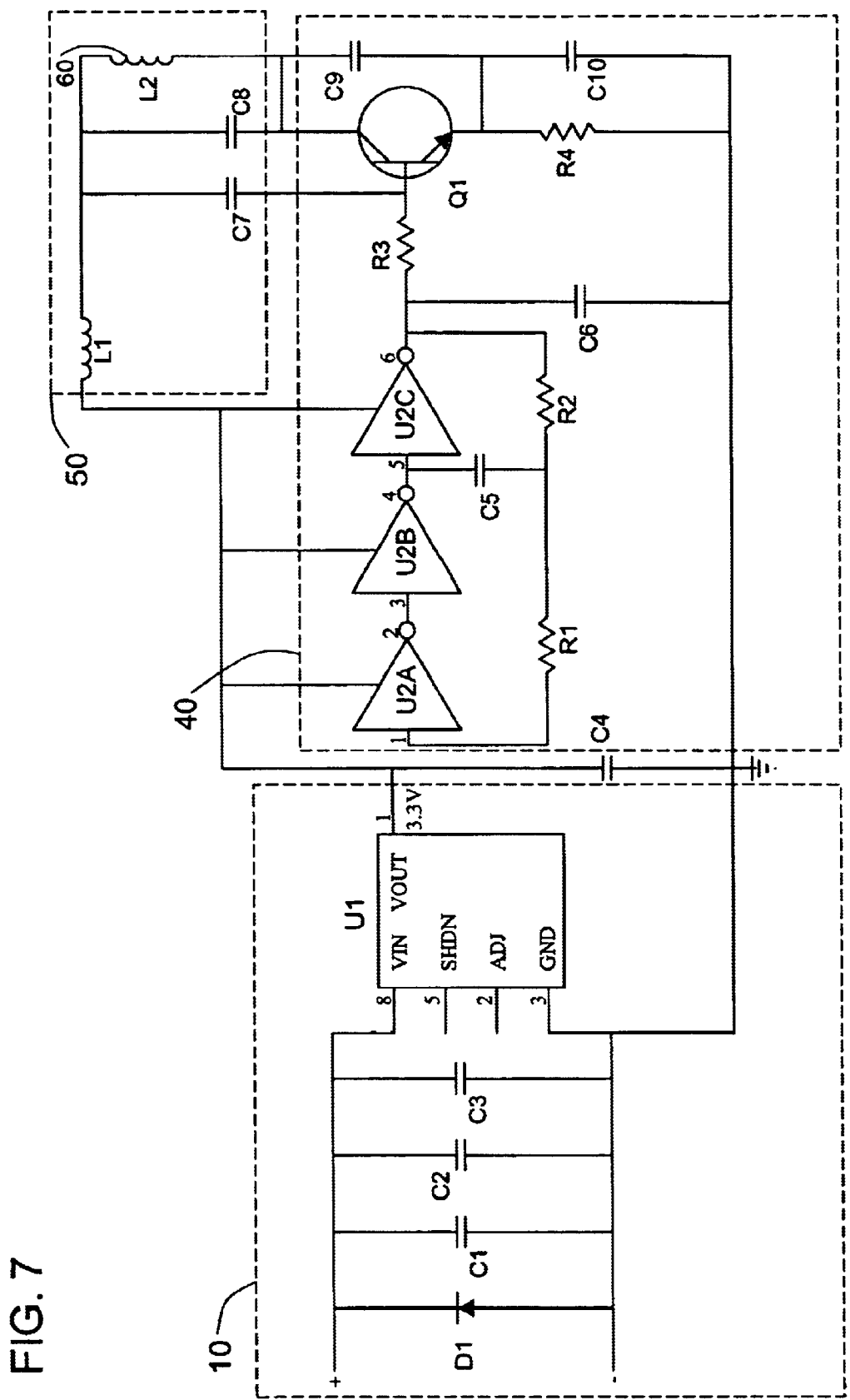
FIG. 7 is a detailed schematic showing the pulse modification, tone generator and RF generator subcircuit portions of FIG. 6.

Referring to FIGS. 6 and 7: The pulse of electrical energy is transmitted from the actuator via the electrical wires 14 connected to each face 12a and 12c of the actuator 12 to a switch or relay 90. The pulse of electrical energy is of sufficient magnitude to cause the switch/relay 90 to toggle from one position to another. Alternatively and preferably, the electrical pulse is first transmitted through a pulse modification circuit in order to modify the character, i.e, current, voltage, frequency and/or pulse width of the electrical signal.

Referring now to FIG. 7: The electrical pulse modification circuit 10 essentially comprises a diode-capacitor array and a voltage regulator U1. The anode and cathode of the diode D1 are connected to each wire 14 respectively. More specifically, the anode is connected via a first wire 14 to the convex face 12a of the actuator 12, and the cathode is connected via the other wire to the concave face 12c of the actuator 12. This connection allows only the voltage pulse generated on the recovery stroke of the actuator 12 to be transmitted past the diode D1.

The pulse modification circuit 10 also comprises a voltage regulator U1, which controls the input electrical pulse downstream of the diode D1. The output signal of voltage regulator U1 is preferably 3.3 volts DC. One or more capacitors C1, C2 and C3 may be provided between the diode D1 and the voltage regulator U1. The capacitors C1, C2 and C3 are connected in parallel with the diode D1. The capacitors C1, C2 and C3 act as filters to provide a more uniform voltage input to the voltage regulator U1. The capacitors C1, C2 and C3 also prevent excessive peak voltages from affecting downstream components of the circuit (such as the voltage regulator U1). The output of the voltage regulator is a pulse of uniform voltage with a duration of approximately 50–100 milliseconds depending on the load applied to the actuator 12. The output voltage signal of the pulse modification circuit 10 may then be transmitted via another wire to the relay switch 90, in order to change the position of the relay switch 90 from one position to another.

Referring again to FIGS. 6 and 7: More preferably, the output of the voltage regulator U1 is used to power tone generator or encoder 40 comprising an inverter array U2, which generates a pulsed tone. This pulsed tone modulates an RF generator section 50 which radiates an RF signal using a tuned loop antenna 60. The signal radiated by the loop antenna is intercepted by an RF receiver 70 and a decoder 80 which generates a relay pulse to activate the relay 90.

The output of the voltage regulator U1 is connected to an inverter array U2, which acts as an encoder 40 for the electrical pulse. More specifically, the output conductor for the output voltage pulse (nominally 3.3 volts) is connected to the input pin of a hex inverter array U2. Preferably 3 of the 6 inverters U2A, U2B and U2C in the inverter array U2 are connected in series, and the other inverters (not shown) are not used (grounded). The last inverter U2C is connected in parallel with a series combination of a resistor R2 and a capacitor C5, which determine the oscillation frequency of the inverter array U2. The first two of the series connected inverters U2A and U2B are connected in parallel with a series combination of a resistor R1 and capacitor C5. In operation, capacitor C5 is charged through the first resistor R2. After the capacitor C5 is fully charged, the voltage then follows resistor R1 which triggers each of the inverters U2A, U2B and U2C to toggle in series. This cyclic toggling of the inverters U2A, U2B and U2C generates a square wave output determined by the RC constant of the R2-C5 combination. Connecting the inverters U2A, U2B and U2C in series generates a faster switching signal for the final inverter U2C of the series and thus a clean, abrupt output signal. Thus, the output of the inverter array U2 is a series of square waves oscillating between 0 and a positive voltage, preferably +3.3 VDC, the duration of the series of square waves being determined by the duration of the output voltage pulse of the voltage regulator U1. By choosing an appropriate R-C time constant, one can determine from the duration of the pulse, the desired pulse width and hence, the number of cycles of the square wave. In the preferred embodiment of the invention, R2 has a value of about 1.2 megaohms and the capacitor C5 has a value of 220 picofarads. Alternatively capacitor C5 is tunable in order to adjust the frequency of oscillation of the inverter array U2. These values provide a one millisecond long square wave having a pulse width of one half millisecond which equates to approximately 100 square wave cycles.

The DC output of the voltage regulator U1 and the square wave output of the inverter array U2 are connected to an RF generator 50. The RF generator 50 consists of tank circuit connected to the voltage regulator U1 through both a bipolar transistor (BJT) Q1 and an RF choke. More specifically, the tank circuit consists of a resonant circuit comprising an inductor L2 and a capacitor C8 connected to each other at each of their respective ends (in parallel). Either the capacitor C8 or the inductor L2 or both may be tunable in order to adjust the frequency of the tank circuit. An inductor L1 acts as an RF choke, with one end of the inductor L1 connected to the output of the voltage regulator U1 and the opposite end of the inductor L1 connected to a first junction of the L2-C8 tank circuit. Preferably, the RF choke inductor L1 is an inductor with a diameter of approximately 0.125 inches and turns on the order of thirty and is connected on a loop of the tank circuit inductor L2. The second and opposite junction of the L2-C8 tank circuit is connected to the collector of BJT Q1. The base of the BJT Q1 is also connected through resistor R3 to the output side of the inverter array U2. A capacitor C7 is connected to the base of a BJT Q1 and to the first junction of the tank circuit. Another capacitor C9 is connected in parallel with the collector and emitter of the BJT Q1. This capacitor C9 improves the feedback characteristics of the tank circuit. The emitter of the BJT is connected through resistor R4 to ground. The emitter of the BJT is also connected to ground through capacitor C10 which is in parallel with the resistor R4. The capacitor C10 in parallel with the resistor R4 provides a more stable conduction path from the emitter at high frequencies.

Figure 8:
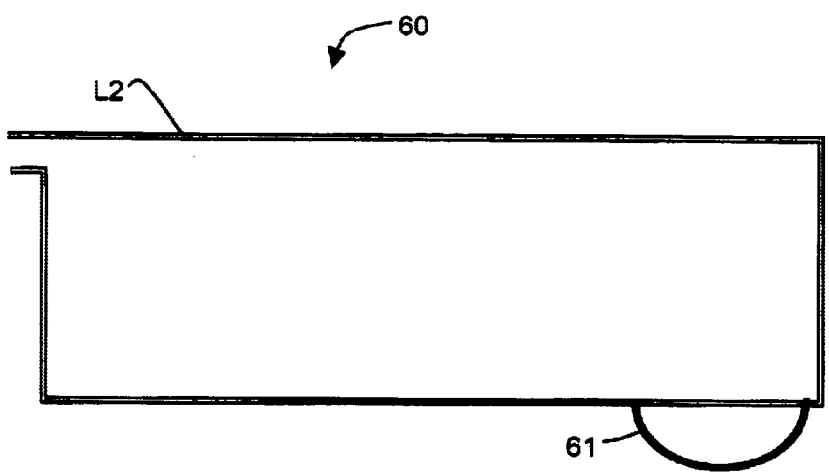
FIG. 8 is a plan view of the tuned loop antenna of FIG. 7 illustrating the jumper at a position maximizing the inductor cross-section.
Figure 9:
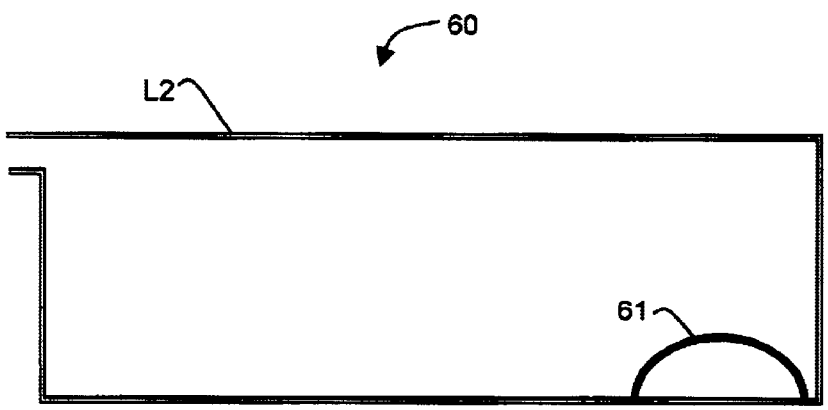
FIG. 9 is a plan view of the tuned loop antenna of FIG. 7 illustrating the jumper at a position minimizing the inductor cross-section.

Referring now to FIGS. 8 and 9: The RF generator 50 works in conjunction with a tuned loop antenna 60. In the preferred embodiment, the inductor L2 of the tank circuit serves as the loop antenna 60. More preferably, the inductor/loop antenna L2 comprises a single rectangular loop of copper wire having an additional smaller loop or jumper 61 connected to the rectangular loop L2. Adjustment of the shape and angle of the smaller loop 61 relative to the rectangular loop L2 is used to increase or decrease the apparent diameter of the inductor L2, and thus tunes the RF transmission frequency of the RF generator 50. In an alternate embodiment, a separate tuned antenna may be connected to the second junction of the tank circuit.

Additional filtering components in the circuit include a grounded capacitor C4 connected to the input of the inverter array U2 and a grounded capacitor C6 connected to the output of the inverter array U2.

In operation: The positive voltage output from the voltage regulator U1 is connected the inverter array U2 and the RF choke inductor L1. The voltage drives the inverter array U2 to generate a square wave output, which is connected to the base of the BJT Q1 through resistor R3. When the square wave voltage is zero, the base of the BJT remains de-energized, and current does not flow through the inductor L1. When the square wave voltage is positive, the base of the BJT Q1 is energized through resistor R3. With the base of the BJT Q1 energized, current is allowed to flow across the base from the collector to the emitter and current is also allowed to flow across the inductor L1. When the square wave returns to a zero voltage, the base of the BJT Q1 is again de-energized.

When current flows across the choke inductor L1, the tank circuit capacitor C8 charges. Once the tank circuit capacitor C8 is charged, the tank circuit begins to resonate at the frequency determined by the circuit's LC constant. For example, a tank circuit having a 7 picofarad capacitor and an inductor L2 having a single rectangular loop measuring 0.7 inch by 0.3 inch, the resonant frequency of the tank circuit is 310 MHz. The choke inductor L1 prevents RF leakage into upstream components of the circuit (the inverter array U2) because changing the magnetic field of the choke inductor L1 produces an electric field opposing upstream current flow from the tank circuit. To produce an RF signal, charges have to oscillate with frequencies in the RF range. Thus, the charges oscillating in the tank circuit inductor/tuned loop antenna L2 produce an RF signal of preferably 310 Mhz. As the square wave output of the inverter turns the BJT Q1 on and off, the signal generated from the loop antenna 60 comprises a pulsed RF signal having a duration of 100 milliseconds and a pulse width of 0.5 milliseconds thus producing 100 pulses of 310 MHz.

The RF generator 50 and antenna 60 work in conjunction with an RF receiver 70. More specifically, an RF receiver 70 in proximity to the RF transmitter 60 (within 150 feet) can receive the pulsed RF signal transmitted by the RF generator 50. The RF receiver comprises a receiving antenna 70 for intercepting the pulsed RF signal (tone). The tone generates a pulsed electrical signal in the receiving antenna 7- that is input to a microprocessor chip that acts as a decoder 80. The decoder 80 filters out all signals except for the RF signal it is programmed to receive, e.g., the signal generated by the RF generator 50. An external power source is also connected to the microprocessor chip/decoder 80. In response to the intercepted tone from the RF generator 50, the decoder chip produces a pulsed electrical signal. The external power source connected to the decoder 80 augments the pulsed voltage output signal developed by the chip. This augmented (e.g., 120 VAC) voltage pulse is then applied to a conventional relay 90 for changing the position of a switch within the relay. Changing the relay switch position is then used to turn an electrical device with a bipolar switch on or off, or toggle between the several positions of a multiple position switch. Zero voltage switching elements may be added to ensure the relay 90 activates only once for each depression and recovery cycle of the flextensional transducer element 12.

Several different RF switching devices may be used that generate different tones for controlling relays that are tuned to receive that tone. In an alternate embodiment, digitized RF signals may be coded and programmable (as with a garage door opener) to only activate a relay that is coded with that digitalized RF signal.

This invention is safe because it eliminates the need for 120 VAC (220 VAC in Europe) lines to be run to each switch in the house. Instead the higher voltage overhead AC lines are only run to the appliances or lights, and they are actuated through the self-powered switching device and relay switch. The invention also saves on initial and renovation construction costs associated with cutting holes and running the electrical lines to/through each switch and within the walls. The invention is particularly useful in historic structures undergoing preservation, as the walls of the structure need not be destroyed and then rebuilt. The invention is also useful in concrete construction, such as structures using concrete slab and/or stucco construction and eliminate the need to have wiring on the surface of the walls and floors of these structures.

While the above description contains many specificities, these should not be construed as limitations on the scope of the invention, but rather as an exemplification of one preferred embodiment thereof. Many other variations are possible, for example:

In addition to piezoelectric devices, the electroactive elements may comprise magnetostrictive or ferroelectric devices;

Rather than being arcuate in shape, the actuators may normally be flat and still be deformable;

Multiple high deformation piezoelectric actuators may be placed, stacked and/or bonded on top of each other;

Multiple piezoelectric actuators may be placed adjacent each other to form an array.

Larger or different shapes of THUNDER elements may also be used to generate higher impulses.

The piezoelectric elements may be flextensional actuators or direct mode piezoelectric actuators.

A bearing material may be disposed between the actuators and the recesses or switch plate in order to reduce friction and wearing of one element against the next or against the frame member of the switch plate.

Other means for applying pressure to the actuator may be used including simple application of manual pressure, rollers, pressure plates, toggles, hinges, knobs, sliders, twisting mechanisms, release latches, spring loaded devices, foot pedals, game consoles, traffic activation and seat activated devices.

Accordingly, the scope of the invention should be determined not by the embodiment illustrated, but by the appended claims and their legal equivalents.

We claim:

1. A self-powered switching device comprising:
    flextensional transducer, said flextensional transducer comprising;
        a first electroactive member having opposing first and second electrode major faces;
        said first opposing major face being substantially convex and said second opposing major face being substantially concave;
        a prestress layer bonded to said second major face of said first electroactive member;
        wherein said flextensional transducer is adapted to deform from a first position to a second position upon application of a force to said flextensional transducer;
        and wherein upon said deformation to said second position, said flextensional transducer is adapted to generate a first voltage potential between said first electroded major face and said second electroded major face;
        a first conductor electrically connected to said first electroded major face of said first electroactive member;
        a second conductor electrically connected to said second electroded major face of said first electroactive member;
    signal transmission means electrically connected to said first and second conductors, said signal transmission means being adapted to generate a first signal in response to said first voltage potential; and
    a switch having a first position and a second position;
    said switch being in communication with said signal transmission means;
    said switch being adapted to change from said first position to said second position in response to said first signal;
    said switch being adapted to change from said second position to said first position in response to said first signal;
    a voltage regulator having an input side and an output side; said input side of said voltage regulator being electrically connected to said first and second conductors;
    said output side of said voltage regulator being electrically connected to said signal transmission means;
    a diode having an anode and a cathode connected in parallel with said flextensional;
    said cathode of said diode being electrically connected to said first conductor and said input side of said voltage regulator;
    said anode of said diode being electrically connected to said second conductor and said input side of said voltage regulator;
    whereby said diode is connected in parallel with first and second electroded major faces of said first electroactive member.

2. The switching device according to claim 1, wherein said signal transmission means comprises:
a third conductor connecting said first conductor to a first pole of said switch; and
a fourth conductor connecting said second conductor to a second pole of said switch.

3. The switching device according to claim 1, further comprising:
pressure application means for application of a force to said flextensional transducer, said pressure application means being adapted to apply a force sufficient to deform said flextensional transducer from said first position to said second position, thereby generating said first voltage potential.

4. The switching device according to claim 1, wherein said signal transmission means comprises a radio frequency generator subcircuit.

5. The switching device according to claim 4, wherein said radio frequency generator subcircuit comprises:
an oscillator array having an input side and an output side;
said input side of said oscillator array being connected to said output side of said voltage regulator;
a BJT having a base connected to said output side of said oscillator array and a grounded emitter; and
a resonant subcircuit having a first and a second junction;
said first junction of said resonant subcircuit being connected to said voltage regulator;
said second junction of said resonant subcircuit being connected to a collector of said BJT.

6. The switching device according to claim 5, wherein said radio frequency generator subcircuit further comprises:
a radio frequency choke connected in series between said output side of said voltage regulator and said first junction of said resonant subcircuit.

7. The switching device according to claim 6, wherein said resonant subcircuit comprises:
a first capacitor having a first and a second plate; and
an inductive loop of a fifth conductor having first and second ends;
said first plate of said first capacitor being connected to said first end of said fifth conductor, thereby forming said first junction of said resonant subcircuit;
said second plate of said first capacitor being connected to said second end of said fifth conductor, thereby forming said second junction of said resonant subcircuit 1.

8. The switching device according to claim 7, wherein said oscillator array comprises:
a first inverter having an input side and an output side;
said output side of said first inverter being electrically connected to said base of said BJT;
a first resistor electrically connected to said output side of said first inverter; and
a second capacitor connected in series between said first resistor and said input side of said first inverter.

9. The switching device according to claim 8, wherein said oscillator array further comprises:
a second inverter having an input side and an output side;
said output side of said second inverter being electrically connected to input side of said first inverter; and
a second resistor electrically connected in parallel with said second capacitor and said second inverter.

10. The switching device according to claim 9, wherein said radio frequency choke comprises an inductor.

11. The switching device according to claim 10, further comprising:
a third capacitor connected to said first and second conductors in parallel with said diode.

12. The switching device according to claim 11, wherein said resonant subcircuit further comprises:
a tuning jumper comprising a sixth conductor having first and second ends each connected to said fifth conductor;
said tuning jumper being adapted to pivot at said first and second ends, thereby rotating relative to said fifth conductor.

13. The switching device according to claim 12, wherein said flextensional transducer further comprises:
a second electroactive member having opposing first and second electroded major faces;
said first opposing major face being substantially convex and said second opposing major face being substantially concave;
said second major face of said second electroactive member being bonded to said first major face of said first electroactive member.

14. The switching device according to claim 13, wherein said first and second electroactive members each comprise a piezoelectric material.

15. The switching device according to claim 10, wherein said signal transmission means further comprises:
a receiver for intercepting a signal generated by said radio frequency generator subcircuit; and
electrical signal generation means for generating an electrical signal in response to said signal intercepted by said receiver, said electrical signal generation means being electrically connected to said receiver;
wherein said switch is adapted to change from said first position to said second position in response to said electrical signal generated by said electrical signal generation means;
and wherein said switch is adapted to change from said second position to said first position in response to said electrical signal generated by said electrical signal generation means.

16. The switching device according to claim 15, wherein said electrical signal generation means comprises a microprocessor for differentiating between a first radio frequency signal and said signal generated by said radio frequency generator subcircuit.

* * * * *